United States Patent [19]

Hardt et al.

[11] Patent Number: 5,754,406
[45] Date of Patent: May 19, 1998

[54] PRINTED CIRCUIT BOARD CARD GUIDE HAVING ISOLATION ARMS AND MEANS FOR SECURING PCB

[75] Inventors: Thomas T. Hardt, Missouri City; Karl N. Walker, Hockley, both of Tex.

[73] Assignee: Compaq Computer Corp., Houston, Tex.

[21] Appl. No.: 659,004

[22] Filed: Jun. 4, 1996

[51] Int. Cl.$^6$ .................................................. H05K 5/00
[52] U.S. Cl. ........................ 361/756; 361/732; 361/740; 361/759; 361/742; 361/758; 439/64
[58] Field of Search ................................ 361/732, 740, 361/741, 742, 747, 756, 758, 759, 801, 802, 804, 825; 439/59, 64, 65, 377, 483, 476.1

[56] References Cited

U.S. PATENT DOCUMENTS

| | | | |
|---|---|---|---|
| 4,736,270 | 4/1988 | Porter | 361/759 |
| 4,914,552 | 4/1990 | Kecmer | 361/759 |
| 5,066,240 | 11/1991 | Verdun | 439/181 |
| 5,138,529 | 8/1992 | Colton et al. | 361/424 |
| 5,297,966 | 3/1994 | Brennian, Jr. et al. | 439/64 |
| 5,308,251 | 5/1994 | Kaufman et al. | 439/64 |
| 5,460,441 | 10/1995 | Hastings et al. | 312/298 |
| 5,469,335 | 11/1995 | Kluth et al. | 361/800 |

Primary Examiner—Leo P. Picard
Assistant Examiner—Anthony Dinkins
Attorney, Agent, or Firm—Jenkens & Gilchrist

[57] ABSTRACT

A card guide assembly for isolating printed circuit boards from each other during insertion and removal from a mounting array. The assembly includes first and second isolation channels that are configured to permit the receipt of a variety of PC board sizes therein and a securement cap for receipt thereover. The cap may be adjustably positioned within the isolation channels for establishing a secured mounting for a variety of PC board sizes. A locking mechanism is provided between the cap and the channels for secured engagement therebetween. The channels are mounted on opposite sides of the PC board connector region permitting conventional mounting of the PC board into a mounting connector.

28 Claims, 3 Drawing Sheets

PRINTED CIRCUIT BOARD CARD GUIDE HAVING ISOLATION ARMS AND MEANS FOR SECURING PCB

BACKGROUND OF THE INVENTION

1. Field of the Invention

The present invention relates to printed circuit board mounting fixtures and, more particularly, to a PC board card housing and guide for facilitating insertion and removal of the card from a mounting connector and preventing the electrical contacts on the card from shorting out against other cards during that process.

2. History of Related Art

Early designs of electrical circuits included a plurality of discrete components which were electrically connected to one another by means of wires. A major advance occurred with the advent of printed circuit boards whereby components were mounted on rigid insulative substrates and electrically interconnected with one another by a pattern of conductive leads formed on the upper and lower surfaces of the substrate by a photoresist and etch process. Each so-called printed circuit card is electrically connected with circuitry on other cards by rows of electrically conductive plated fingers spaced from one another along both sides of one edge of the printed circuit card. The card edge containing the conductive fingers is received into a card edge connector in which each plated finger removably engages a connector contact for electrical connection to other circuitry on other printed circuit cards.

Rows of card edge connectors are conventionally mounted adjacent to one another in rows on a, so-called, motherboard with the printed circuit cards being received into each of the card edge connectors. The connectors mounted on the motherboard have their contacts interconnected with one another by means of similar conductive wiring placed on the surfaces of the motherboard. The use of the printed circuit card edge connector concept in the design of electronic equipment, such as digital computers, allows cards to be added and removed for repair, upgrade, and/or changes in functionality in the circuitry.

Originally, a rule of practice in the maintenance of electrical circuitry, such as computer hardware, was that of always turning the power to the motherboard off before cards were added or removed from the card edge connectors. Such a policy was for both reasons of safety of the technician as well as to avoid injury to the circuitry on the cards.

Recent innovations in this area have addressed the desirability to insert and remove printed circuit cards from electrical equipment, such as computer hardware, when the computer is electrically connected and operational, i.e. "hot." In these cases, it is now possible to disconnect the power from only the connector of the card to be inserted and removed while allowing the adjacent cards to remain "hot." In these situations, and because of the close spacing between adjacent card edge connectors on a motherboard, it is possible to inadvertently allow the plated fingers along the edge of the printed circuit card to touch an adjacent card which is hot and thereby produce a short circuit and create a hazard to the technician and the circuitry on both of the PC cards. Data stored within memory elements of the circuitry may be irretrievably lost when this occurs. It is thus important to minimize the exposure of adjacent PC boards during the insertion or removal process.

It would be an advantage therefore to provide a printed circuit (PC) board assembly that would eliminate the possibility of an electrical short while not interfering with the normal functional insertion and removal of the PC board assembly. The present invention provides such an assembly by providing a PC board card guide for securement to the PC board. The card guide is comprised of at least one pair of isolation arms in the form of a channel that is adapted to receive a wide variety of PC board sizes. The channel arms are configured to extend outwardly on opposite sides of the PC board forming a nonconductive bumper to eliminate accidental engagement between adjacent PC boards.

SUMMARY OF INVENTION

The present invention relates to a PC board card guide. More particularly, the present invention comprises a PC board card guide formed of electrically insulative material that may be assembled to the PC board to maintain its spaced relationship from adjacent boards during the insertion and/or removal process. The card guide comprises first and second isolation arms in the form of a channel adapted for receipt of the PC board therein and for placement adjacent one end of the connector region thereof A securement cap is provided and adapted for receipt within the arms to secure a PC board therein in a generally parallel spaced relationship therewith. The cap is adjustable within the arms for affording flexibility in accommodating various PC board sizes.

In another embodiment, the above-described invention includes at least two channels for securement to the PC board on opposite sides of the connector region. Individual securement caps may be provided for each channel, or a single cap may connect both channels to secure the PC board therein. In another embodiment, the above described invention includes the isolation arms being formed with ridged side walls which are adapted for receiving the cap therebetween. The ridged side walls are constructed to form a ratchet assembly for facilitating securement of the cap and permitting the adjustable positioning of the cap to various sizes of printed circuit boards therein. The cap may include means for gripping the upper surface thereof for removal of the cap from the channel for access to the printed circuit board.

BRIEF DESCRIPTION OF THE DRAWINGS

A more complete understanding of the method and apparatus of the present invention may be had by reference to the following Detailed Description when taken in conjunction with the accompanying Drawings wherein.

DETAILED DESCRIPTION

Figure 1:
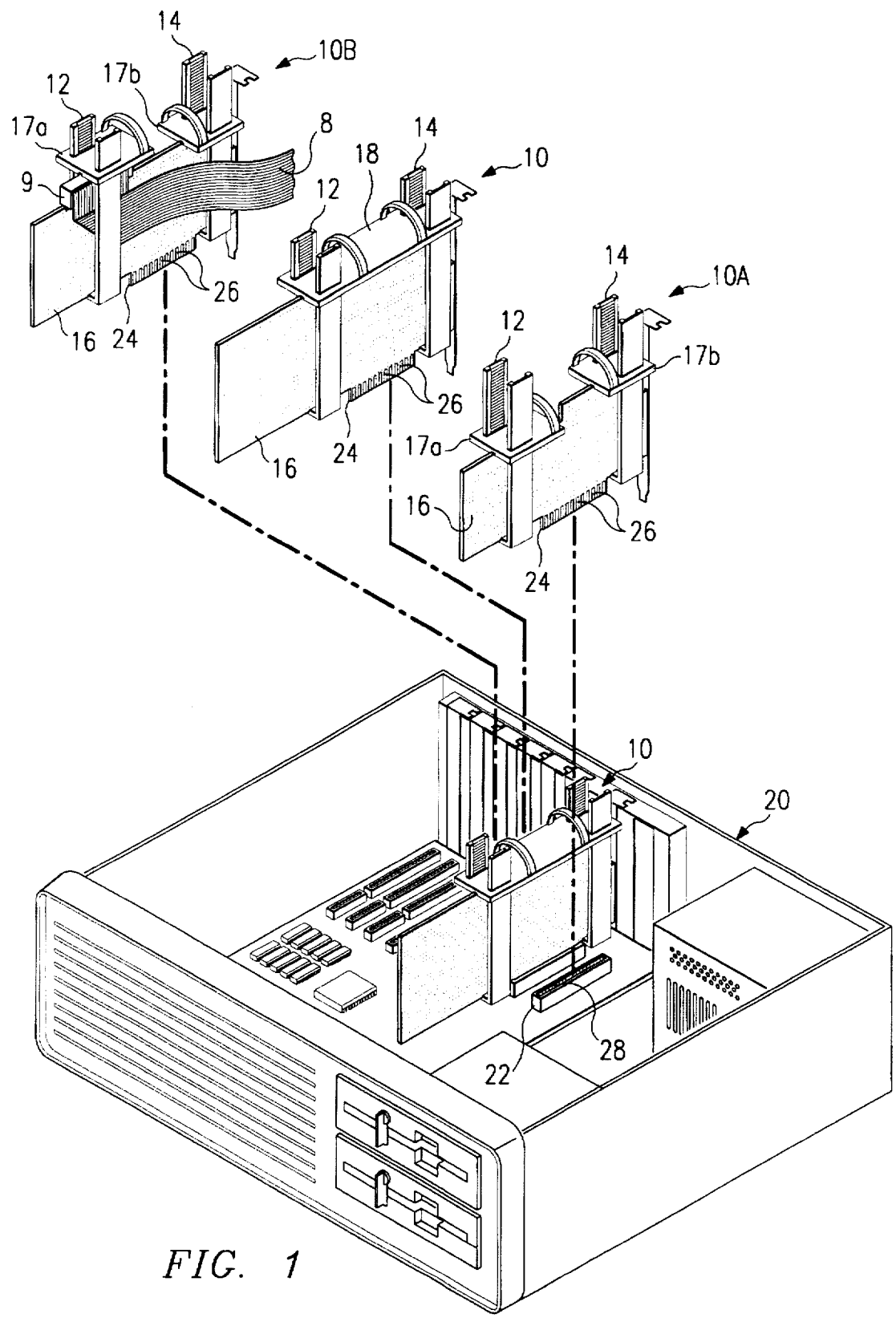
FIG. 1 is a perspective view of the several embodiments of card guide assemblies inserted within a computer chassis.

Referring first to FIG. 1, there is shown a perspective view of one embodiment of a plurality of PC boards and card guide assemblies 10, 10A and 10B, constructed in accordance with the principles of the present invention. Each PC board and card guide assembly includes at least one channel member 12 which is adapted for receiving a printed circuit board (PC) 16 therein. A second channel member 14 is preferably used in association with first channel member 12 in one embodiment of the invention. A cap 18 is provided for securement over the printed circuit board 16 and may be mounted individually to each of the channels 12 and 14 as a single cap 17 or to both channels 12 and 14 as a double cap 18. The double cap 18 extends between and is attached to each of the channels 12 and 14 for secured mounting of both channels to the circuit board.

Still referring to FIG. 1, the plurality of PC board and card guide assemblies 10, 10A and 10B of the present invention are shown either in, or being inserted in, an electric circuit housing such as a: computer chassis 20. A variety of combinations of card guide assemblies is also presented to illustrate the flexibility of the present invention as discussed below. Card edge connectors 22 within the hardware mounting chassis 20 are adapted for receiving each of a plurality of conductive contact fingers 26 which extend along opposed edges of each of the PC boards 16 and form a connector region 24. Each of the contact fingers 26 are gold plated and adapted for removable engagement with mating contact fingers 28 mounted within the interior of the card edge connector 22. The connector region 24 provides for both electrical and mechanical mounting of the PC board 16 when it is received within the card slot of the card edge connector 22. However, misdirection or misalignment of the PC board 16 during insertion and/or removal of the PC board 16 from the connector 22 mounted within the computer chassis 20, while the circuitry is "hot," can cause inadvertent contact of the conductive fingers 26 along its connector region 24 with the conductive regions of the PC board within adjacent card edge connectors resulting in an electrical short. Electrical shorts create a safety hazard for the service technician as well as damage to both the PC boards and the computer. In some instances, a short can cause a computer to be shut down and/or the loss of valuable data. The PC board and card guides 10A and 10B of the present invention thus provide a means for isolating individual PC boards 16 one from the other during the insertion and removal process to prevent accidental shorting therebetween and for facilitating the insertion and removal process.

Referring still to FIG. 1, the variety of combinations of card guide assemblies permits accommodation of various PC board shapes and constructions. For example, PC board and card guide assembly 10 incorporates a PC board 16 of generally uniform size wherein channels 12 and 14 are received on opposite sides of connector region 24 with a double cap 18 received positioned thereacross. PC board and card guide assembly 10A illustrates a PC board 16 of nonuniform dimensions wherein channels 12 and 14 are secured to opposite sides of connector region 24 by single caps 17. PC board and card guide assembly 10B illustrates a PC board of uniform width but which has mounted near one end a cable connector 9 to which is connected a ribbon cable 8 leading to external circuitry. The channels 12 and 14 are secured to opposite sides of connector region 24 by single caps 17a and 17b.

As can be seen one of the caps 17b of assembly 10A is positioned at a greater height in channel 14 than is the cap 17a within channel 12 to accommodate the differing widths of the different parts of the PC board with which they are in contact. Likewise, PC board and card guide assembly 10B illustrates the accommodation of a ribbon cable 21 which is coupled to the PC board 16 by a cable connector 23. The cable connector 23 also creates a height differential for the channels 12 and 14 on opposite sides of the connector region 24, which height differential is accommodated by the two single caps 17a and 17b used in conjunction therewith. It may thus be seem that a wide variety of PC board shapes and sizes and/or peripheral component aspects thereof may be accommodated in accordance with the principles of the present invention.

Figure 2:
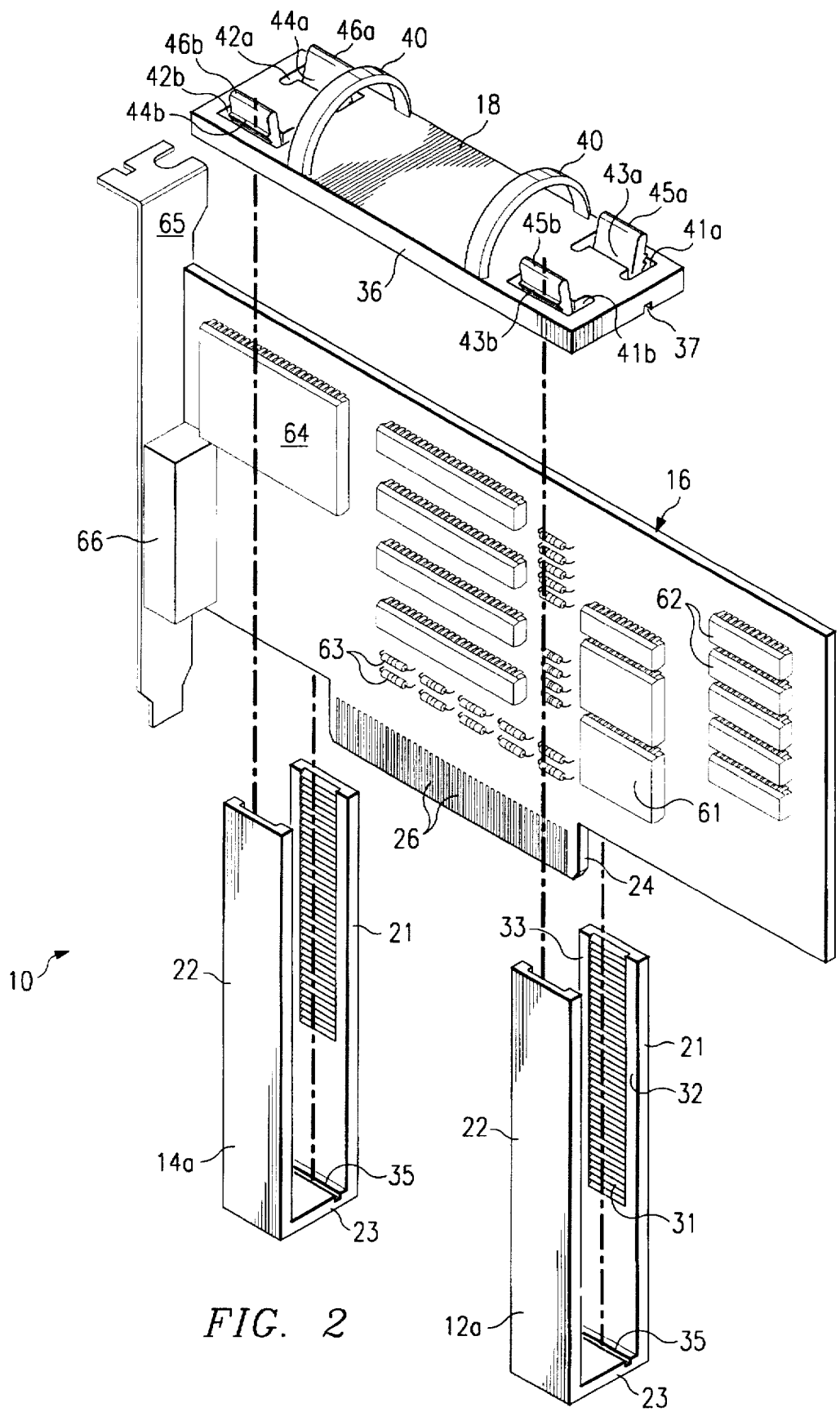
FIG. 2 is an enlarged, exploded view of one of the card guide assemblies of FIG. 1 illustrating the removal of a PC card therefrom.

Referring now to FIG. 2, there is shown a PC board 16 in the form of a hot plug PCI card which is to be inserted and removed from a card edge connector on the motherboard of a computer while the power to the computer is turned on. Each of the first and second channel members 12 and 14 of the PC board assembly and card guide 10 include a pair of upstanding spaced apart arms 21 and 22 which are joined at the lower end by a transversely extending bottom wall 23 to form a generally U-shaped channel member. The upper portion of the inside wall of each of the arms 21 and 22 has formed thereon an array of laterally spaced ridges 31 each of which extends transversely across the breadth of the inner wall from a first laterally extending shoulder portion 32 to a second laterally extending shoulder portion 33. The ridges 31 are laterally spaced from one another and include inwardly extending teeth-like edges, each of which is angled downwardly away from the upper open end of the U-shaped channel member toward the transversely extending lower wall 23. The teeth-like edges of the ridges 31 include a stepped surface 31a extending in a plane generally transverse to the longitudinal axis of the arms 21 and 22 and a ramped surface 31b extending in a plane at a sharp angle upwardly and outwardly from the longitudinal axis of the arms 21 and 22. Preferably, the ridges 31 form one-half of a pair of ratchet surfaces as is further explained below. The transversely extending ridges 31 are shown in FIG. 2 as extending slightly more than half the length of each of the arms 21 and 22, however, it can be seen that they may extend virtually the entire length of the arm if necessary to accommodate PC cards of relatively small width. The bottom wall 23 of each of the channel members 12 and 14 include a transversely extending slot 35 approximately the same width as the thickness of the printed circuit card 16 to snugly receive the edges of the card into the slot 35.

The cap portion 18 of the PC board and card guide assembly 10 includes an flat, elongate body portion 36 within the lower surface of which is formed an longitudinally extending groove 37 approximately the same width as the edge of the printed circuit card 16 for snugly receiving that edge. The upper surface of the body portion 36 includes a pair of semicircular loop portions 41 which are firmly affixed to the upper surface of the body portion 36 so that upward pressure by the fingers of a technician within the loops 40 will serve to pull the entire PC board and card guide assembly 10 in the upward direction.

Both the U-shaped channel members 12 and 14 and the cap members 17 and 18 are preferably formed by molding from an electrically insulative material such as thermoplastic or nylon, however, other materials may be used as long as they are electrically insulative.

Two pairs of openings 41a–b and 42a–b are formed in the body portion 36 of the cap 18. Each opening 41a and 41b is sufficiently wide to receive one of the arms 21 and 22 of the channel member 12 and each opening is spaced from the other approximately the same width as the distance between the arms 21 and 22 of the channel member 12. Similarly, each of the openings 42a and 42b are wide enough to receive the arms 21 and 22 of the channel member 14 and the openings 42a and 42b are spaced from one another a sufficient distance to receive the arms 21 and 22 of the channel member 14. Referring to both FIGS. 2 and 3, within each of the openings 41a–b and 42a–b is a tab 43a and b and 44a and b, respectively, with each tab being positioned on the inside edge of each of the respective openings within which the tab is located. Each of the tabs 43a–b and 44a–b may, for example, be integrally molded with the body portion 36 of the cap 18 and include a upwardly extending tab release arm 45a–b and 46a–b. Each tab is transversely displacable by pressure against its release arm tending to push the two adjacent tab pairs toward one another. Release of pressure on the tab release arms 45a–b and 46a–b allows them to resiliently spring back away from one another and partially the close their respective openings 41a–b and 42a–b. The lower outside portion of each of the tabs 43a–b and 44a–b includes an engagement face upon which is formed a plurality of transversely extending ridges 51 for gripping engagement with mating ones of the ridges 31 on the insides of the arms 21 and 22 of the channel members 12 and 14.

Figure 3:
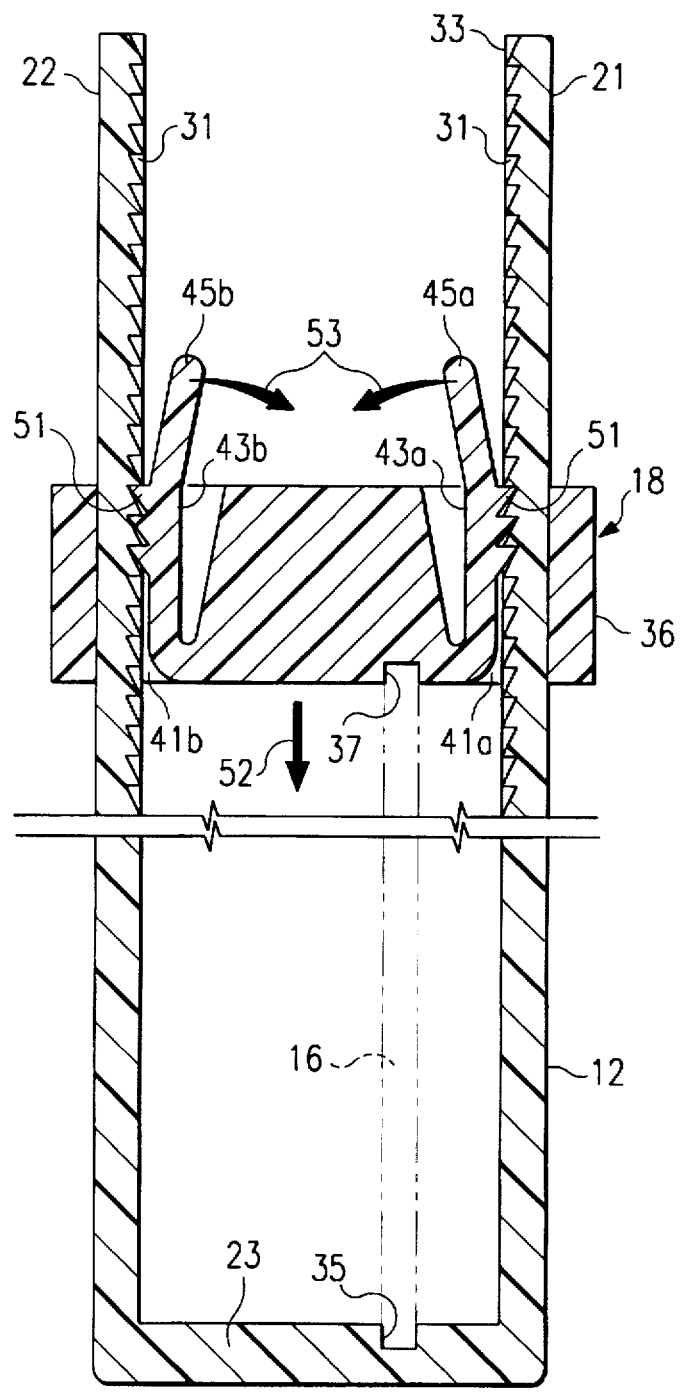
FIG. 3 is an enlarged side elevational cross-sectional view of a card guide assembly illustrating the placement of a PC board therein.

As best shown in FIG. 3, the ridges 51 on the outside edges of the engagement face of each of the tabs 42a–b and 43a–b are formed with sharp angular tooth-like edges each including a stepped surface 51a extending in a plane generally parallel to the upper surface of the body portion 36 and a ramped surface 51b extend in a plane extending at a sharp angle downwardly and inwardly from the upper surface of the body portion 36. When the cap portion 18 is placed down over the upper open ends of the arms 21 and 22 of the channel members 12 and 14, the upper ends are received into the opening pairs 41a–b and 42a–b, respectively.

Downward pressure in the direction of arrow 52 on the upper surface of the cap 18 causes resilient lateral displacement of the release arms of the tabs 45a–b and 46a–b toward one another so that the teeth-like ridges 51 and 31 on the tabs of the cap and the arms of the channel members, respectively, slide passed each other due to the engagement of the ramped surfaces of the respective ridges 31 and 51. Once downward pressure on the cap 18 in the direction arrow 52 is released, the stepped surfaces of each of the respective ridges 31 and 51 engage each other to lock the cap from upward movement thereby gripping the printed circuit board 16 between the grooves 35 and 37 on the channel members 12 and 14 and cap 18, respectively. In general, a ratchet-like action between the ridges 31 on the channel members 12 and 14 and the ridges 51 on the cap 18 allow relative movement in a direction to clamp a PC board 16 between the two parts but prevent movement in the opposite direction unless the tab release arms are depressed.

As can also be seen from FIG. 3, inward pressure on the tab release arms 45a and 45b in the direction of arrows 53 flexes the tabs toward one another to cause the stepped surfaces 51a of the ridges 51 on the tabs 43a and 43b to disengage from the stepped surfaces 31a of the ridges 31 on arms 21 and 22 of the U-shaped channel member 12. The cap portion 18 can then be gripped by the loops 40 and lifted upwardly in the opposite direction of arrow 52 and removed from the upper open ends of the arms 21 and 22 thereby allowing the printed circuit card 16 to be released and removed from within the channel between the arms 21 and 22. As can also be seen from FIG. 3, the length to which the ridges on the inside arms 21 and 22 of the channel members 12 extend down its length is determined by the width of the printed circuit card 16 to be gripped by the card guide assembly of the present invention.

Referring again to FIGS. 2 and 3 together, a printed circuit card 16 contains a plurality of electrical components 61–64 mounted thereon and which are connected to one another by printed wiring (not shown) on the card. One end of the card includes a bracket 65 on which a connector 66 is mounted for external connection from the card 16 to other circuitry. The connector edge 24 of the card 16 contains a plurality of gold plated edge contacts 26 to be received within the slot of a printed circuit card edge connector as illustrated in FIG. 1.

The PC board and card guide assembly 10 is assembled to the printed circuit card 16 by insertion of the card down between the opposed arms 21 and 22 of the U-shaped channel members 12 and 14 so that the lower edges of the card 16 engage the slots 35 in the bottom walls 23 of the channel members 12 and 14. Once the printed circuit card is in place within the channel members, the cap portion 18 is lowered down onto the upper opened ends 21 and 22 of the channel members 12 and 14 so that those ends are received up into respective ones of the openings 41a and b and 42a and b formed in the corners of the body portion 36 of the cap 18. As downward pressure is applied to the cap 18, the resilient tabs 43a and b and 44a and b ratchet back and forth as the ridges 51 on the engagement surfaces of the tabs pass over the ridges 31 on the inside walls of the U-shaped channel members. Once the cap 18 is in place so that the upper edge of the printed circuit board 16 is received into the slot 37 in the lower surface of the body portion 36 of the cap 18, the opposed stepped surfaces 51a and 31a of the respective ridges 51 and 31 lock the cap 18 in place so that the PC board and card guide assembly 10 is rigidly affixed to the printed circuit card 16. When the completed card guide assembly and printed circuit card 16 are inserted down into the chassis to insert the connector edge 24 of the card 16 into a printed circuit card edge connector, it is impossible for the circuit board 16 to move very far in either lateral direction. The insulative side walls of the U-shaped channel members act as insulative bumpers to prevent any electrically conductive portions of the PC board such as the conductive fingers 26 along both edges of the connector region 24 from coming in contact with any adjacent printed circuit cards or other unprotected electrical circuitry which might produce a short. Similarly, when the circuit board 16 secured in the card guide assembly 10 is removed from a card edge connector, the insulative side walls of the U-shaped channel members acting as bumpers make it virtually impossible for the assembly to move very far in either lateral direction and thereby cause any shorting of the conductive fingers 26 against any other circuitry.

The construction of the card guide assemblies 10A and 10B of FIG. 1 which only include half caps 17a–17b is essentially the same as that described above in connection with the assembly 10 which includes a full cap 18. The openings, tabs and grooves formed in the half-caps 17a and 17b are the same as those on each of the opposite ends of the full cap 18. The caps 17a and 17b are, of course, installed one at a time over the areas of their respective U-shaped channel members to accommodate the specific width requirements of the PC board to be received within each channel.

Although a preferred embodiment of the method and apparatus of the present invention has been illustrated in the accompanying drawings and described in the foregoing detailed description, it is to be understood that the invention is not limited to the embodiment(s) disclosed, but is capable of numerous rearrangements, modifications and substitutions without departing from the spirit of the invention as set forth and defined by the following claims.

We claim:

1. A printed circuit board card guide comprising:
   first and second isolation arms defining a channel adapted to receive a printed circuit board and for lateral extension outwardly thereof along opposite faces of said printed circuit board;

said first and second isolation arms being connected one to the other by a base region, said base region having a slot formed therein which is sized for receipt of said printed circuit board therein, to secure mounting of said first isolation arm a first, fixed distance from one surface of said printed circuit board and said second isolation arm a second, fixed distance form an opposite surface of said board; and means for securing said isolation arms to said printed circuit board.

2. The printed circuit board card guide as set forth in claim 1 wherein said printed circuit board includes a connector region formed along one edge of said board for engagement with a mating connector and said isolation arms are adapted for securement to said printed circuit board card adjacent a first end of said connector region.

3. The printed circuit board card guide as set forth in claim 2 and further including third and fourth isolation arms adapted for securement to a printed circuit board for lateral extension outwardly thereof adjacent a second opposite end of said connector region.

4. The printed circuit board card guide as set forth in claim 1 wherein said securement means comprises a cap adapted for receipt between said first and second isolation arms in demountable engagement therewith to rigidly secure said printed circuit board to said isolation arms.

5. The printed circuit board card guide as set forth in claim 4 wherein said demountable engagement means comprises transversely extending ridges formed on the inside surfaces of said isolation arms and the opposed engagement surfaces of said cap for releasably securing one with the other and thereby mounting the arms to the printed circuit board.

6. The printed circuit card guide as set forth in claim 5 wherein the transversely extending ridges on the inside surfaces of the isolation arms and the opposed engagement surfaces of said cap are opposed ratchet teeth which are respectively angled so that movement of the cap along the arms in a direction to secure the printed circuit board is possible but movement of the cap in the opposite direction requires separation of the engaged ratchet teeth from one another.

7. The printed circuit card guide as set forth in claim 6 wherein the first and second isolation arms are connected to one another by a base region and in which the cap includes openings therein to receive the ends of the first and second isolation arms to allow movement of the cap toward the base region to grip the edges of the PC board therebetween.

8. The printed circuit card guide as set forth in claim 7 in which the opening in the cap includes integrally formed resilient tabs on inner ridges of which are formed the ratchet teeth, said tabs being resiliently movable toward each other to release said ratchet teeth and allow removal of said cap from between said ratchet arms.

9. A method of isolating conductive portions of a printed circuit board from other components during the installation and removal of said circuit board from said components of an assembly, said method comprising steps of:

providing at least one spacer assembly formed of insulative material and adapted for extending laterally along the opposite faces of a printed circuit board;

inserting said printed circuit board within said spacer assembly; and securing said printed circuit board within said spacer assembly for protection of said board during the insertion and removal of said printed circuit board from said component assembly.

10. The method as set forth in claim 9 wherein said step of providing a spacer assembly includes the steps of forming a channel member having two opposed and spaced apart, elongated side walls adapted for extending along said opposite faces of said printed circuit board and wherein said step of securing said printed circuit board within said channel members comprises the step of providing a cap adapted for receipt within said channels and for rigid attachment thereto for securing said printed circuit board between said cap and said channel members.

11. The method as set forth in claim 10 and including the steps of forming serrated surfaces on outwardly facing surfaces of said cap and forming serrated surfaces on the inside faces of said channels, said opposed serrated surfaces being adapted for mating engagement with one another for securing the cap to the channels.

12. The method as set forth in claim 10 wherein said printed circuit board is formed with a connector region and further including the steps of providing first and second channel members for receipt of said printed circuit board therein, said channel members being adapted positioning upon said printed circuit board on opposite sides of said connector region to extend therebetween.

13. The method as set forth in claim 12 and further including the step of providing an elongate cap adapted for receipt within both of said first and second channel members.

14. The method as set forth in claim 12 and further including the step of providing first and second caps, each being adapted for receipt within separate ones of said channel members.

15. The method as set forth in claim 9 wherein said step of providing a spacer assembly includes the step of forming said spacer assembly from insulative material.

16. The method of claim 11 wherein the serrated surfaces on said cap and said channels slide across one another as the cap is received onto said channel members and lock against each other when the cap is moved in the opposite direction and the step of securing said printed circuit board comprises:

moving the cap down onto said channel members until the cap wedges the PC card against the channel members and is held in position by the interlocking serrated surfaces.

17. A card guide assembly for a PC board having a connector region for reducing the possibility of inadvertent electrical contact with other electrical components, said card guide comprising:

at least one card guide adapted for securement to a printed circuit board adjacent to a first side of said connector region thereof, said card guide comprising oppositely disposed elongated members upstanding from a base member and adapted for receipt of said PC board therein; and means for securing said PC board between said elongated members for facilitating the handling of said PC board assembly.

18. The apparatus as set forth in claim 17 wherein said card guide comprises a generally U-shaped member having an elongated recess formed in a central portion thereof adapted for receipt of said PC board therein.

19. The apparatus as set forth in claim 18 wherein said generally U-shaped member is constructed with serrated side walls and adapted for receipt of said securement means therein in mating engagement with said serrated side wall portions.

20. The apparatus as set forth in claim 17 where in said securement means comprises a cap adapted for receipt between said oppositely disposed elongated members.

21. The apparatus as set forth in claim 20 wherein said securement means further comprises transversely extending ridge s formed on the inside surfaces of said elongated members and the opposed engagement surfaces of said cap for releasably securing one with the other and thereby mounting the arms to the printed circuit board.

22. The apparatus as set forth in claim 21 wherein the transversely extending ridges on the inside surfaces of said elongated members and the opposed engagement surfaces of said cap are opposed ratchet teeth which are respectively angled so that movement of the cap along said elongated members in a direction to secure the printed circuit board is possible but movement of the cap in the opposite direction requires separation of the engaged ratchet teeth from one another.

23. The apparatus as set forth in claim 22 wherein said elongated members are connected to one another by a base region and wherein said cap includes openings therein to receive the ends of said elongated members to allow movement of the cap toward the base region to grip the edges of the PC board therebetween.

24. The apparatus as set forth in claim 23 in which the opening in the cap includes integrally formed resilient tabs on inner ridges of which are formed the ratchet teeth, said tabs being resiliently movable toward each other to release said ratchet teeth and allow removal of said cap from between said elongated members.

25. The apparatus as set forth in claim 17 wherein said card guide assembly further includes a second card guide adapted for securement to said printed circuit board adjacent to a second, opposite side of said connector region thereof.

26. The apparatus as set forth in claim 25 wherein said securement means comprises at least one cap adapted for receipt between said oppositely disposed elongated members of said card guide.

27. The apparatus as set forth in claim 26 wherein said cap is formed for receipt within a single card guide.

28. The apparatus as set forth in claim 26 wherein said cap is formed in an elongate configuration for receipt within said first and second card guides.

* * * * *